(12) United States Patent
Sakaguchi (10) Patent No.: US 6,797,414 B2
(45) Date of Patent: Sep. 28, 2004

(54) ORGANIC EL DEVICE AND METHOD OF MANUFACTURING ORGANIC EL DEVICE

(75) Inventor: Yoshikazu Sakaguchi, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/164,598

(22) Filed: Jun. 10, 2002

(65) Prior Publication Data

US 2002/0187367 A1 Dec. 12, 2002

(30) Foreign Application Priority Data

Jun. 8, 2001 (JP) ........................................ 2001-174444

(51) Int. Cl.⁷ .............................................. H05B 33/26
(52) U.S. Cl. ...................... 428/690; 428/917; 428/212; 313/504; 313/506
(58) Field of Search ................................. 428/690, 917, 428/212; 313/504, 506; 427/66; 257/101

(56) References Cited

U.S. PATENT DOCUMENTS

| | | | |
|---|---|---|---|
| 6,215,245 B1 | * 4/2001 | Mori ........................ | 313/506 |
| 6,221,520 B1 | * 4/2001 | Takaki et al. ............... | 428/699 |
| 6,403,987 B1 | * 6/2002 | Miki et al. .................... | 257/99 |
| 2003/0117071 A1 | * 6/2003 | Lee et al. .................. | 313/512 |

FOREIGN PATENT DOCUMENTS

| | | | |
|---|---|---|---|
| JP | 09245968 | * | 9/1997 |
| JP | 9-245968 A | | 9/1997 |
| JP | 10-302966 | * | 11/1998 |

* cited by examiner

*Primary Examiner*—Dawn Garrett
(74) *Attorney, Agent, or Firm*—McGuireWoods LLP (57) ABSTRACT

An organic EL (Electroluminescence) device includes a $Li_2O$ layer which is metallic oxide at an interface of a first cathode with an organic luminescent layer, and the $Li_2O$ layer has a concentration gradient in which a concentration becomes high at a side of the interface with the organic luminescent layer. Therefore, it is possible to obtain a high rectification ratio, to make a driving voltage low, and to make a luminescent efficiency high.

8 Claims, 9 Drawing Sheets

ORGANIC EL DEVICE AND METHOD OF MANUFACTURING ORGANIC EL DEVICE

BACKGROUND OF THE INVENTION

1. Field of the Invention

The present invention relates to an organic EL (Electroluminescence) device and a method of manufacturing the organic EL device, and more particularly, relates to the organic EL device including metallic oxide at an interface between an organic layer including an organic luminescent layer at least and a cathode and the method of manufacturing the organic EL device.

The present application claims priority of Japanese Patent Application No. 2001-174444 filed on Jun. 8, 2001, which is hereby incorporated by reference.

2. Description of Related Art

Figure 12:
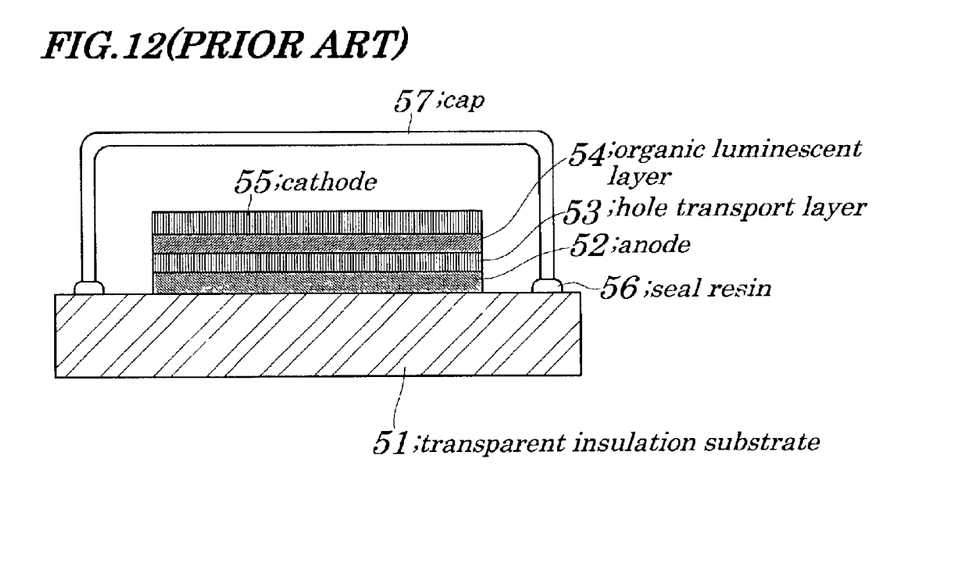
FIG. 12 is a sectional view showing a conventional organic EL device.

As one of EL elements used for a display device for an information apparatus or a like, an organic EL device is developed. FIG. 12 is a sectional view showing a structure of a conventional well-known organic EL device. The organic EL device, as shown in FIG. 12, is provided with a transparent insulation substrate 51 made of a glass substrate or a like, an anode (lower electrode) 52 made of transparent conductive material such as an ITO (Indium Tin Oxide) formed on the transparent insulation substrate 51, a hole transport layer 53 formed on the anode 52, an organic luminescent layer 54 formed on the hole transport layer 53, a cathode (upper electrode) 55 made of AlLi (Aluminum Lithium) or a like formed on the organic luminescent layer 54, and a cap 57 attached to the transparent insulation substrate 51 on which an element main portion including the anode 52, the hole transport layer 53, the organic luminescent layer 54 and the cathode 55 is formed so as to cover the element main portion via seal resin 56.

As the seal resin 56, for example, UV (Ultra-Violet) curable resin is used, and is cured by irradiating light including UV rays to the seal resin 56 from a light source so as to seal the EL element.

In the above-mentioned organic EL device, since there are many cases in that the interface between the organic luminescent layer 54 and the cathode 55 is incomplete, an unstable defect exists from the first. The defect indicates that an impurity level caused by a grid defect or a like is formed at a position at which an interface level must be formed. With existence of the defect, a path generates in addition to a normal carrier path, and then a leak current increases. Also, there is a possibility in that the cathode 55 and the anode 52 become short-circuited. Therefore, a characteristic of the organic EL device becomes unstable, and a high rectification ratio can not be obtained. As a result, when a simple matrix drive is performed, a pixel short-circuit and a cross talk occur.

Figure 13:
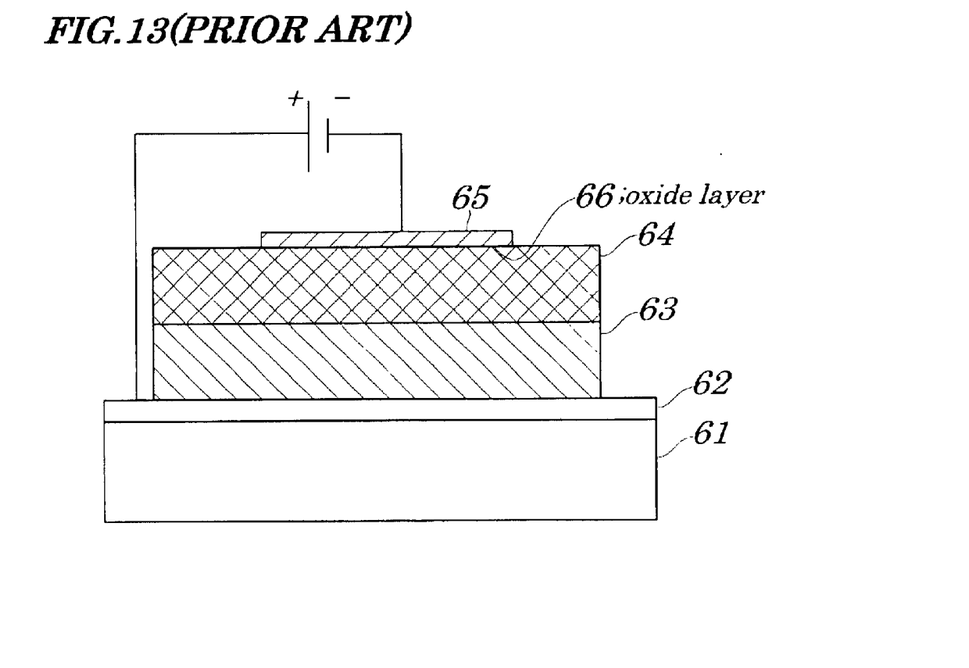
FIG. 13 is a sectional view showing another conventional organic EL device.

Now, conventionally, there is another well-known organic EL device in which an oxide layer is formed at an interface between an organic luminescent layer and a cathode so as to make a characteristic stable. For example, Japanese Patent Application Laid-open No. Hei 9-245968 discloses such the organic EL device. The organic EL device, as shown in FIG. 13, is provided with a glass substrate 61, an anode 62 made of ITO formed on the glass substrate 61, a hole transport material layer 63 made of an organic material formed on the anode 62, an electron transport material layer 64 made of an organic material formed on the hole transport material layer 63, and a cathode 65 formed on the electron transport material layer 64. An oxide layer 66 (or a hydroxide layer) is formed at an interface between the electron transport material layer 64 and the cathode 65.

As a material for the cathode 65, a univalent metal such as Li (lithium), Na (sodium) and K (potassium), a bivalent metal such as Ca (calcium), and a trivalent metal such as Al (aluminum) are used. Concretely, when a film of the material of the cathode 65 is formed, the oxide layer 66 is formed by making a concentration of oxygen molecules or hydrogen molecules in an atmosphere higher than that of ordinary film formation.

With this arrangement, a work function of metals or ionization potential of organic material at the interface between the electron transport material layer 64 which is an organic luminescent layer and the cathode 65 is lowered, whereby a low voltage drive is possible. As a result, it is possible to obtain the organic EL device which operates stably.

However, in the organic EL device disclosed in Japanese Patent Application Laid-open No. Hei 9-245968, since only the oxide layer is formed at the interface between the organic luminescent layer 64 and the cathode 65, there is a problem in that it is difficult to obtain a high rectification ratio.

In other words, in Japanese Patent Application Laid-open No. Hei 9-245968, when the film of the material of the cathode 65 is formed in manufacturing the organic EL device, the oxide layer 66 is formed by making a concentration of oxygen molecules or hydrogen molecules in the atmosphere higher than that of ordinary film formation. Therefore, since it is difficult to control the concentration of oxygen molecules or hydrogen molecules in a desirable range, a yield of manufacturing the organic EL device gets worse, a throughput lowers, and an enough high rectification ratio can not be obtained. Further, the oxide layer 66 (or the hydroxide layer) is an insulation layer, and therefore, when the oxide layer 66 (or the hydroxide layer) is formed evenly, there are problems in that a drive voltage is high and a luminescent efficiency lowers.

SUMMARY OF THE INVENTION

In view of the above, it is an object of the present invention to provide an organic EL device and a method of the organic EL device capable of obtaining a high rectification ratio with a low drive voltage and capable of making a luminescent efficiency high.

According to a first aspect of the present invention, there is provided an organic EL device in which an anode made of a transparent electrode, an organic layer including an organic luminescent layer at least, and a cathode sequentially stacked on a transparent insulation substrate, the cathode including a metallic oxide in an interface with the organic layer wherein; the metallic oxide is formed so as to have a concentration gradient in which a concentration becomes high at a side of the interface with the organic layer.

In the foregoing, a preferable mode is one wherein the cathode includes a first cathode and a second cathode and the first cathode includes the metallic oxide in the interface with the organic layer.

Also, a preferable mode is one wherein the cathode includes a plurality of layers and a cathode among the plurality of layers includes the metallic oxide in the interface with the organic layer.

Also, a preferable mode is one wherein the concentration gradient of the metallic oxide varies curvedly along a direction of a film thickness of the cathode.

Also, a preferable mode is one wherein the concentration gradient of the metallic oxide varies linearly along the direction of the film thickness of the cathode.

Furthermore, a preferable mode is one wherein a concentration of the metallic oxide becomes 0 (zero) in the film thickness of the cathode forming the interface with the organic layer.

According to a second aspect of the present invention, there is provided a method of manufacturing an organic EL device in which an anode made of a transparent electrode, an organic layer including an organic luminescent layer at least, and a cathode sequentially stacked on a transparent insulation substrate, the cathode including metallic oxide in an interface with the organic layer wherein;

the transparent insulation substrate on which the anode and the organic layer are sequentially stacked is put into a vacuum evaporation apparatus, and a first metal capable of forming the metallic oxide and a second metal for forming the cathode are co-evaporated in a manner that the metallic oxide having a concentration gradient in which a concentration becomes high at a side of the interface with the organic layer is formed.

According to a third aspect of the present invention, there is provided a method of manufacturing an organic EL device in which an anode made of a transparent electrode, an organic layer including an organic luminescent layer at least, and a cathode sequentially stacked on a transparent insulation substrate, the cathode including metallic oxide in an interface with the organic layer, the method including:

a step of laminating the anode and the organic layer on the transparent insulation substrate sequentially;

a step of putting the transparent insulation substrate into in a vacuum evaporation apparatus to which a first metal capable of forming the metallic oxide and a second metal for forming the cathode are supplied; and a step of forming the metallic oxide having a concentration gradient in which a concentration becomes high at a side of the interface with the organic layer by co-evaporating the first metal and the second metal.

In the foregoing, a preferable mode is one wherein a surface of the first metal is previously oxidized.

Also, a preferable mode is one wherein co-evaporation is performed while introducing oxygen into the vacuum evaporation device, and is performed with control in a manner that the oxygen in the vacuum evaporation apparatus decreases gradually from a start of the co-evaporation.

Also, a preferable mode is one wherein the first metal is made of Li or Mg, and the second metal is made of Al or Mg.

With these configurations, since an interface between a cathode and an organic layer including an organic luminescent layer at least includes metallic oxide, and the metallic oxide is formed to have a concentration gradient in which a concentration becomes high at a side of the interface with the organic layer, defects existing in the interface between the organic layer and the cathode are embedded by the metallic oxide, and the interface is formed completely.

Also, when the organic EL device is manufactured, a metal capable of forming metallic oxide by surface oxide under an atmosphere including oxygen such as an air atmosphere and a cathode formation metal are used as evaporation sources, and both of the metals are co-evaporated. Therefore, it is possible to form metallic oxide having a concentration gradient in which a concentration becomes high at the side of the interface with the organic layer.

Therefore, a rectification ratio is improved by preventing short-circuit while applying backward bias application to an element and by saving a leak current. Also, when passive matrix driving is performed, it is possible to prevent pixel short-circuit and cross-talk.

Further, by providing the concentration gradient, it is possible to make the driving voltage low and to make the luminescent efficiency high.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes for carrying out the present invention will be described in further detail using embodiments with reference to the accompanying drawings.

First Embodiment

Figure 1:
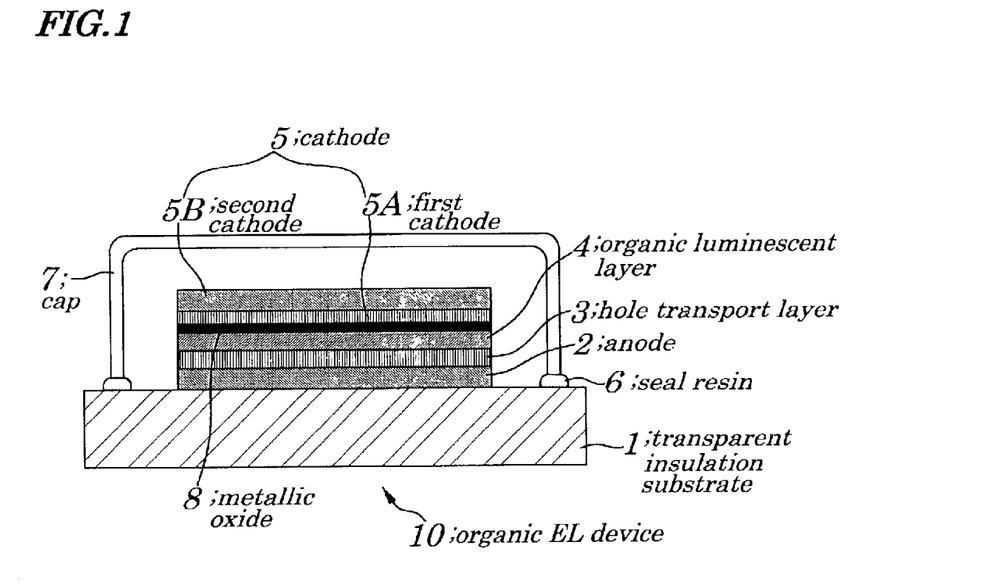
FIG. 1 is a sectional view showing an organic EL device according a first embodiment of the present invention.

FIG. 1 is a sectional view showing an organic EL device according a first embodiment of the present invention, FIG.

Figure 2:
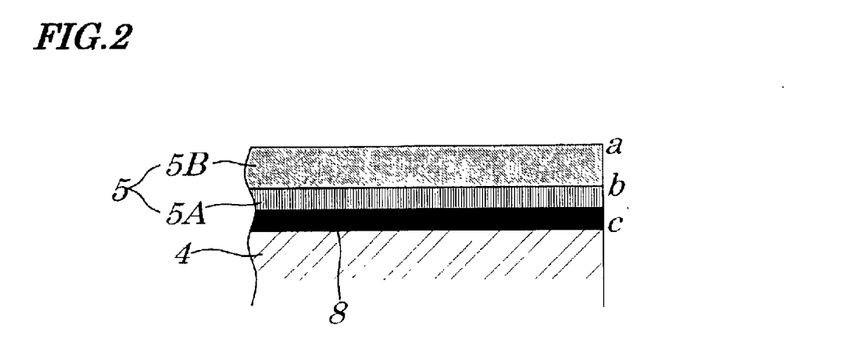
FIG. 2 is an enlarged view showing a part near an interface between an organic luminescent layer and a cathode in the organic EL device.
Figure 3:
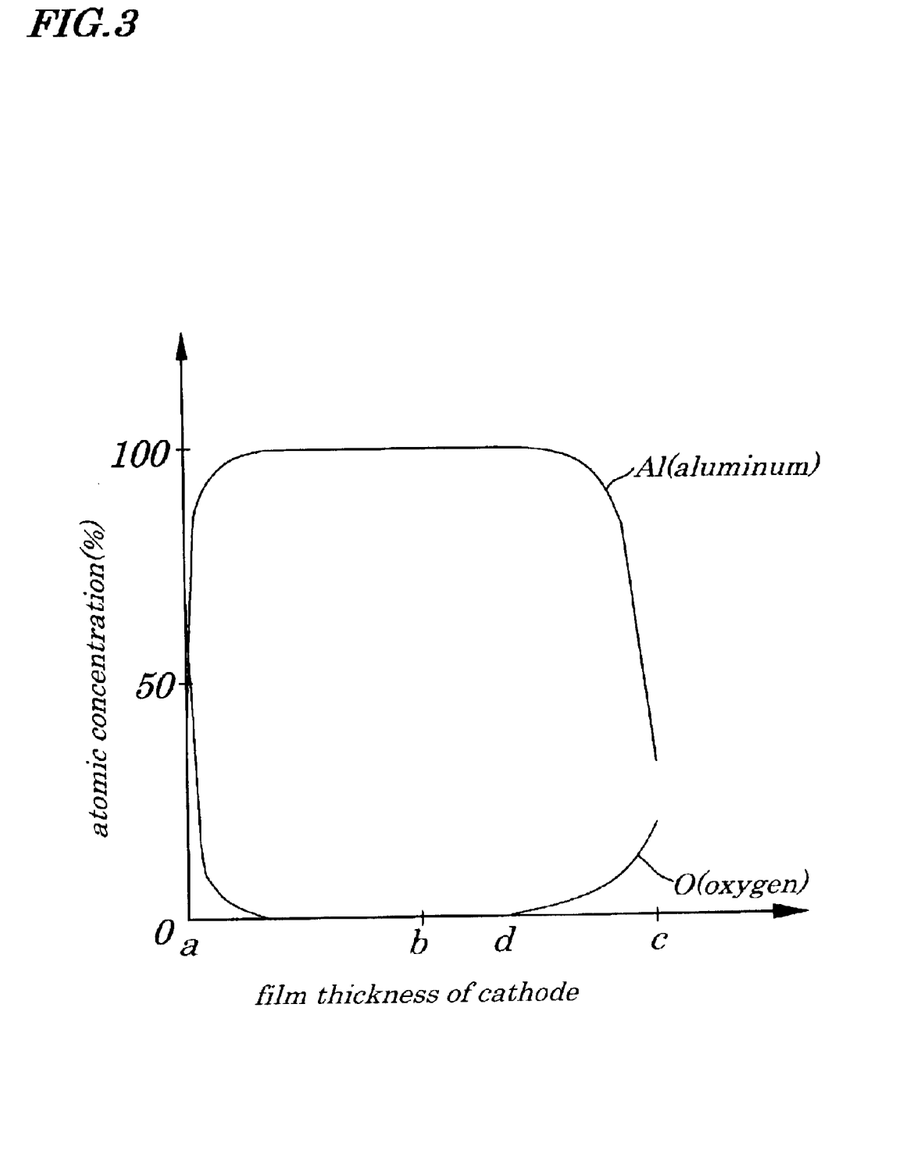
FIG. 3 is a view showing a relationship between a thickness of a cathode (horizontal axis) and an atomic concentration (vertical axis) in the organic EL device as an Auger analysis result.
Figure 4A:
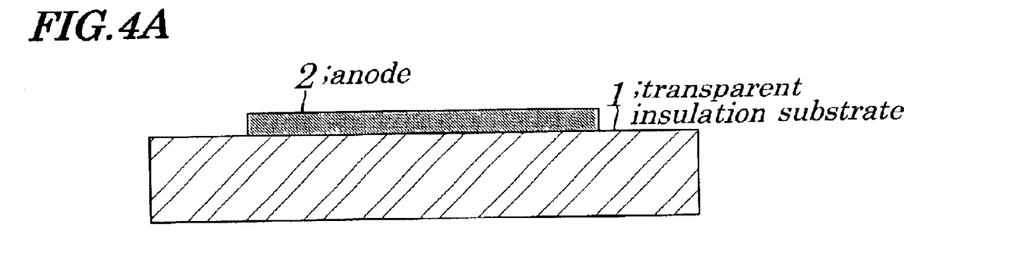
FIGS. 4A to 4D are process views showing a method of manufacturing the organic EL device in a sequence of steps.
Figure 4B:
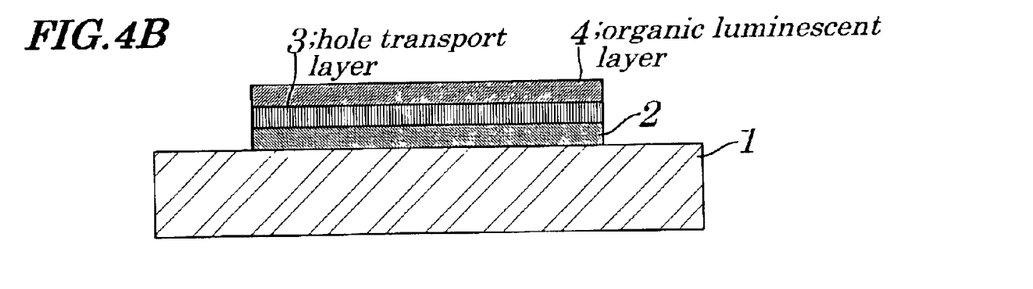
Figure 4C:
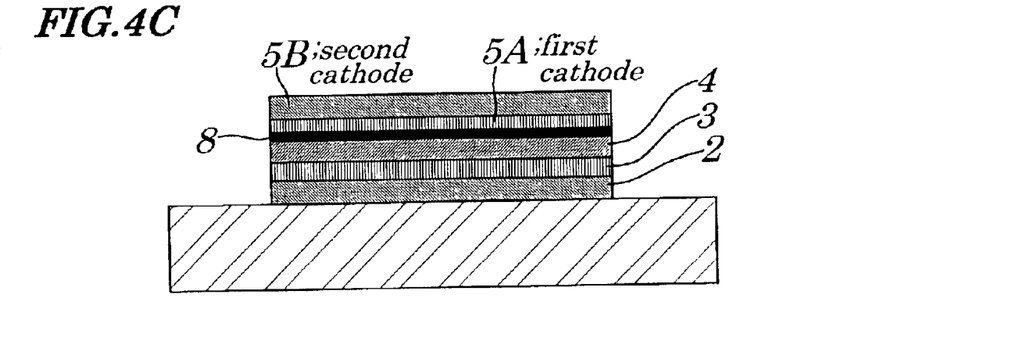
Figure 4D:
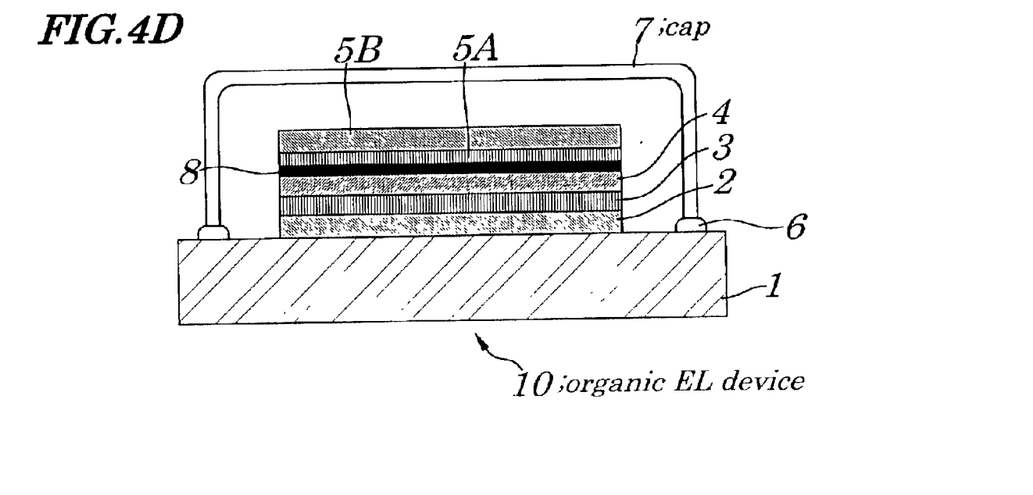
Figure 5:
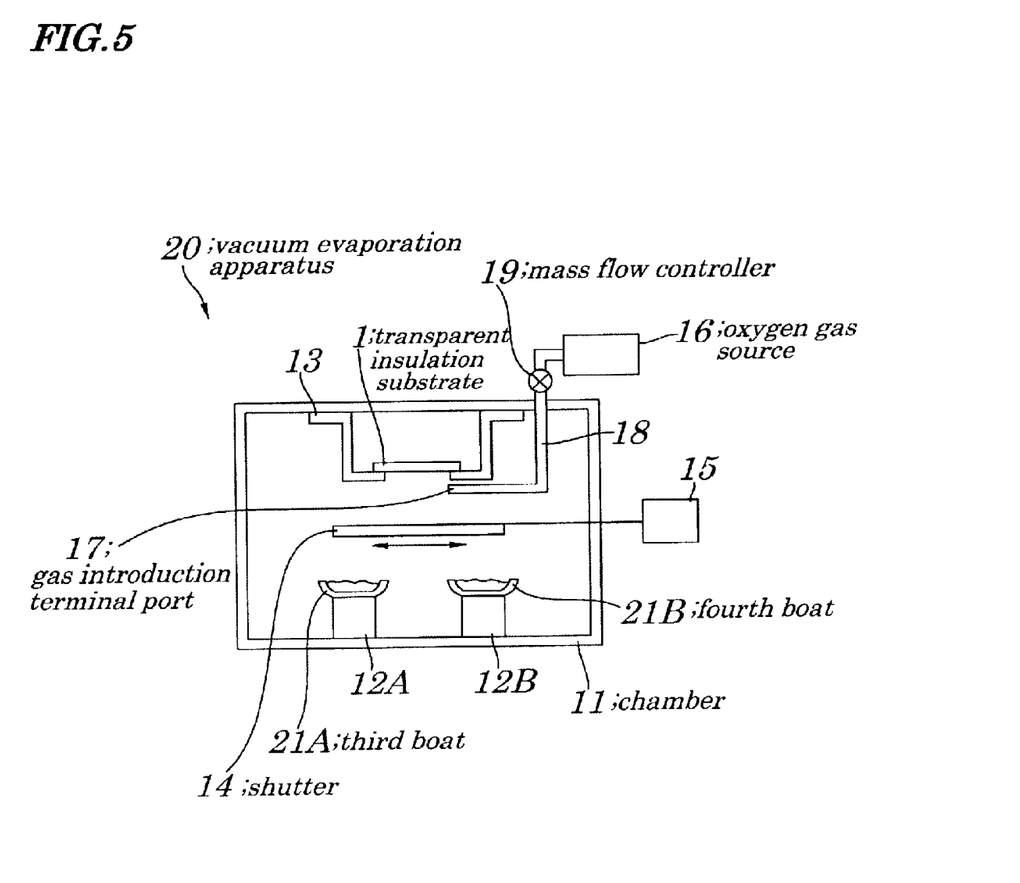
FIG. 5 is a schematic view showing a vacuum evaporation apparatus used in main steps of the method of manufacturing the organic EL device.
Figure 6:
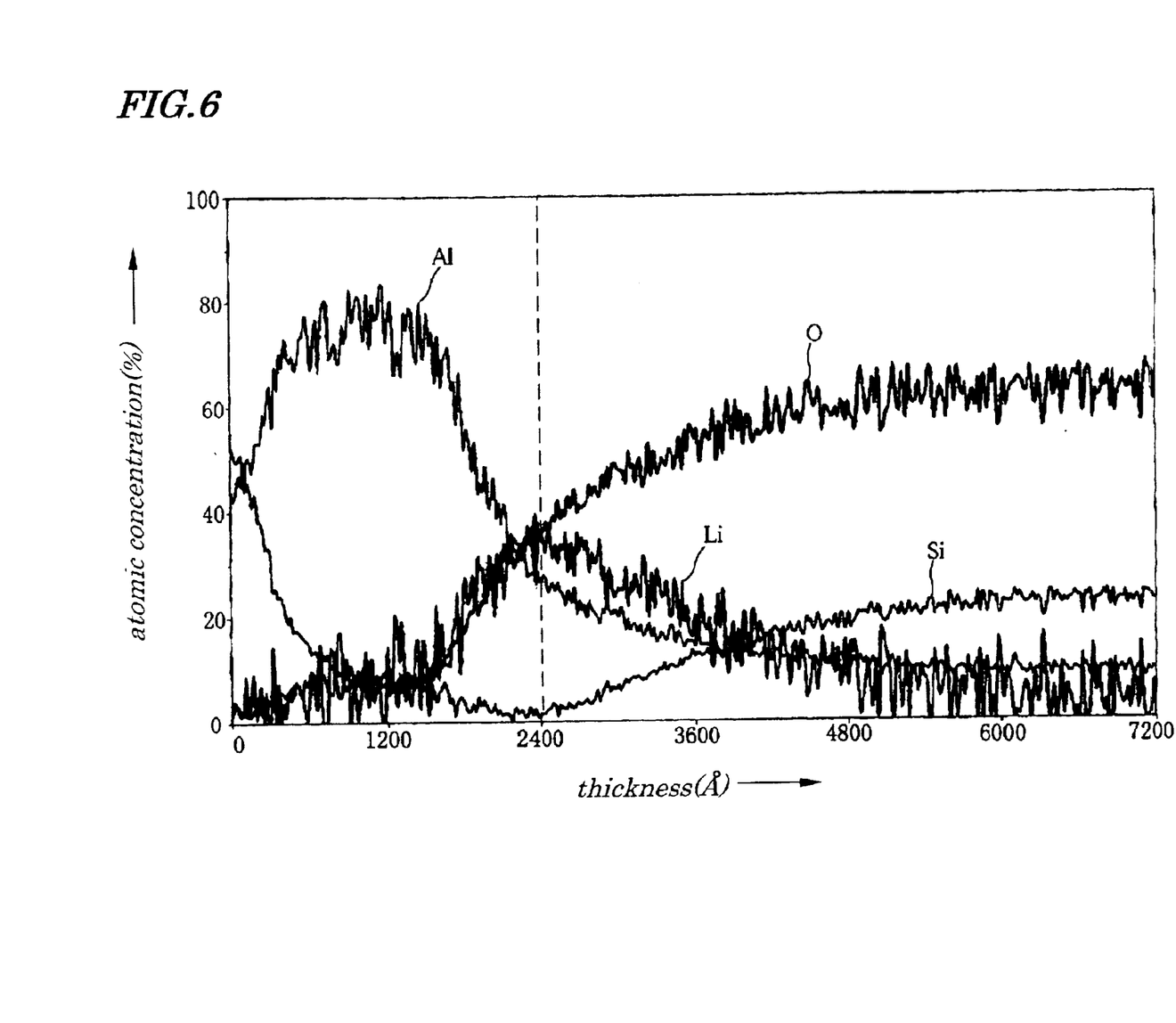
FIG. 6 is a view showing an analysis result by using an analysis thin film sample in which a film of Li left under an oxygen atmosphere is formed on a glass substrate and a film of Al is stacked on the film of Li.
Figure 7:
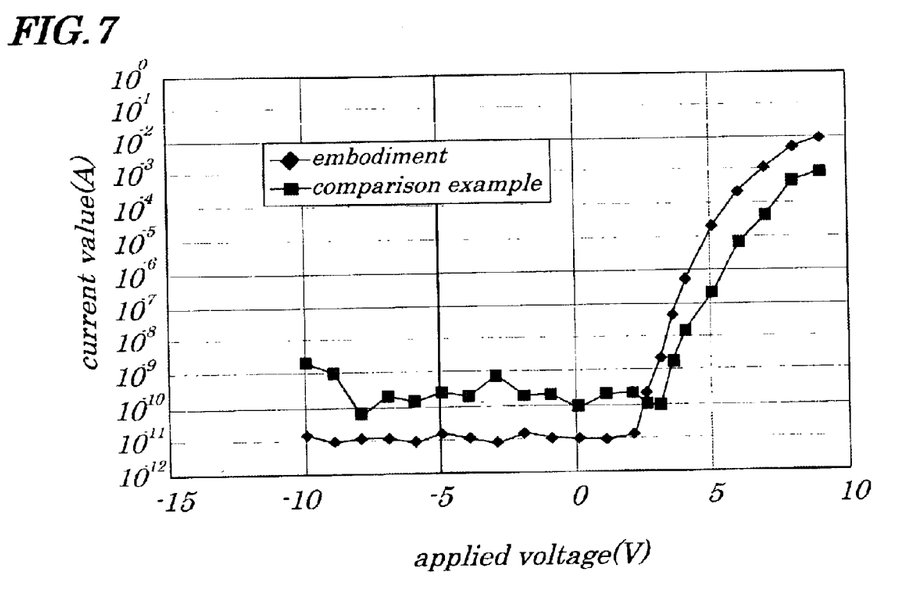
FIG. 7 is a view showing rectification characteristics of the first embodiment according to the present invention and a comparative example.
Figure 8:
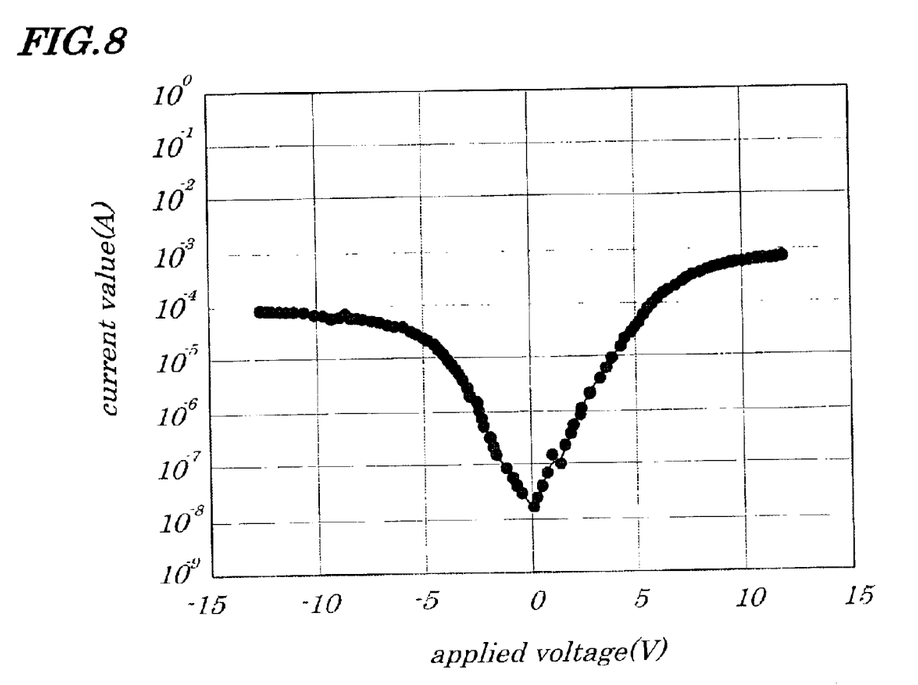
FIG. 8 is a view showing a rectification characteristic of a reference example of the organic EL device.

2 is an enlarged view showing a part near an interface between an organic luminescent layer and a cathode in the organic EL device, FIG. 3 is a view showing a relationship between a thickness of a cathode (horizontal axis) and an atomic concentration (vertical axis) in the organic EL device as an Auger analysis result, FIGS. 4A to 4D are process views showing a method of manufacturing the organic EL device in a sequence of steps, FIG. 5 is a schematic view showing a vacuum evaporation device used in main steps of the method of manufacturing the organic EL device, FIG. 6 is a view showing an analysis result by using an analysis thin film sample in which a film of Li left under an oxygen atmosphere is formed on a glass substrate and a film of Al is stacked on the film of Li, FIG. 7 is a view showing rectification characteristics of the first embodiment according to the present invention and a comparative example, and FIG. 8 is a view showing a rectification characteristic of a reference example of the organic EL device.

An organic EL device 10 according to the first embodiment, as shown in FIG. 1, is provided with a transparent insulation substrate 1 made of a glass substrate or a like, an anode 2 made of a transparent conductive material such as an ITO (Indium Tin Oxide) formed on the transparent insulation substrate 1, a hole transport layer 3 made of α-NPD (N,N'-diphenyl-N,N'-bis(1-naphthyl))-(1,1'-biphenyl)-(4,4'-diamine) or a like formed on the anode 2, an organic luminescent layer 4 made of $Alq_3$ (tris-8-quinolinol) aluminum) or a like formed on the hole transport layer 3, a first cathode 5A made of AlLi (Aluminum Lithium) or a like formed on the organic luminescent layer 4, a second cathode 5B made of Al or a like formed on the first cathode 5A, and a cap 7 attached to the transparent insulation substrate 1 on which an element main portion including the anode 2, the hole transport layer 3, the organic luminescent layer 4, the first cathode 5A, and the second cathode 5B is formed so as to cover the element main portion via seal resin 6. In this case, the first cathode 5A made of AlLi includes metallic oxide 8 made of a $Li_2O$ (lithium oxide) layer so as to have a concentration gradient of which a concentration is high at a side of an interface with the organic luminescent layer 4.

FIG. 2 is an enlarged view showing a part near an interface between the organic luminescent layer 4 and a cathode 5 (the first cathode 5A and the second cathode 5B) in the organic EL device 10.

FIG. 3 is a view showing a relationship between a thickness of the cathode 5 (horizontal axis) and an atomic concentration (vertical axis) of Al and O (Oxygen) included in the cathode 5 in the organic EL device as an Auger analysis result. As apparent from FIG. 2 and FIG. 3, an atomic concentration of oxygen (hereafter, called an oxygen concentration) in the first cathode 5A becomes a maximum at an interface (position c) with the organic luminescent layer 4, decreases gradually as a position is apart from the interface along a direction of a film thickness, and becomes 0 (zero) at a position d where is over a half position of the film thickness. Also, the oxygen destiny varies in a curve along the direction the film thickness. The above explanation is given about the oxygen concentration, however, this explanation is applicable to the $Li_2O$ layer which is metallic oxide. In other words, as described above, the $Li_2O$ layer included in the interface with the organic luminescent layer 4 in the first cathode 5A is formed so as to have a concentration gradient of which a concentration is high at a side of the interface with the organic luminescent layer 4. On the other hand, an atomic concentration of Al becomes a minimum at an interface (position c), increases gradually as a position is apart from the interface along a direction of the film thickness, and becomes approximately 100% over the position d. Further, the second cathode 5B is made of approximately 100% of Al. Concrete explanations of a method of forming the $Li_2O$ layer will be given later.

With the organic EL device 10 according to the first embodiment, since the interface with the organic luminescent layer 4 in the first cathode 5A includes the $Li_2O$ layer which is metallic oxide, and the $Li_2O$ layer is formed so as to have the concentration gradient of which the concentration is high at the side of the interface with the organic luminescent layer 4, defects existing in the interface are covered with the $Li_2O$ layer, and therefore, the unstable level becomes stable and a complete interface is formed. With this arrangement, since the leak current is prevented from increasing, and the short-circuit of the cathode 5 and the anode 2 is avoided, it is possible to make a characteristic of the organic EL device stable. As a result, a high rectification ratio can be obtained.

Also, the second cathode 5B made of Al or a like is provided to make the cathode 5 thicker and to make a wiring resistance small. With this arrangement, it is possible to save power and to prevent a luminance unevenness while being luminescent.

Also, with the organic EL device 10 according to the first embodiment, as apparent from FIG. 3, since the concentration of the $Li_2O$ layer included in the first cathode 5A at the interface with the organic luminescent layer 4 becomes 0 (zero) at the position d in the first cathode 5A, the following effects can be obtained.

Since the $Li_2O$ layer which is the metallic oxide functions as an insulating material, by setting the concentration of $Li_2O$ to 0 (zero) in the first cathode 5A, it is possible to prevent a resistance value of the cathode 5 from increasing. Therefore, it is possible to reduce a driving voltage for that. Also, by setting the concentration of $Li_2O$ to 0 (zero) in the first cathode 5A, an injection efficiency of electrons is improved, and therefore, a carrier balance of holes and electrons is improved so as to increase a current used for luminance and a luminescent efficiency (cd/A) for the current becomes higher. Therefore, since the driving voltage is reduced and the current efficiency is improved, the luminescent efficiency for the power in driving becomes higher and a consumption power can be reduced.

Now, a method of manufacturing the organic EL device 10 according to the first embodiment will be explained in order of steps with reference to FIG. 4A to FIG. 4D. First, as shown in FIG. 4A, on the transparent insulation substrate 1 made of a glass substrate which is sufficiently washed, a film of ITO of which a thickness is approximately 150 nm is formed as a transparent conductive film by a sputtering technique. Then, the ITO is patterned by a well-known photolithography technique in a manner that a luminescent area of an EL element is 2 mm□ (2 mm×2 mm) so as to form the anode 2. Thereafter, the transparent insulation substrate 1 is washed with IPA (Iso-Propyl Alcohol), pure water, and then ultrasonic cleaning is performed in IPA. Subsequently, the transparent insulation substrate 1 is washed by using an UV (UltraViolet) ozone washer so as to remove residual organic substances on a surface thereof.

Next, as shown in FIG. 4B, the hole transport layer 3 and the organic luminescent layer 4 are sequentially formed on the anode 2. The hole transport layer 3 and the organic luminescent layer 4 are formed as follows.

A molybdenum boat (first boat) to which α-NPD of 100 mg is supplied is arranged as a hole transport material and a molybdenum boat (second boat) to which $Alq_3$ of 100 mg is supplied is arranged as a luminescent material in a vacuum evaporation device so that these become individual evaporation sources. Then, after the transparent insulation substrate 1 is stored in the vacuum evaporation device, inside of the vacuum evaporation device is exhausted to a degree of vacuum of $2 \times 10^{-4}$ Pa (Pascal), and heating of the first boat is started when the degree of vacuum reaches $2 \times 10^{-4}$ Pa. Then, a heating temperature is controlled until the α-NPD in the first boat reaches a constant speed which is an evaporation speed of 0.3 nm/sec, a shutter provided at an upper part in the vacuum evaporation device is opened so as to start film-forming of the α-NPD. The shutter is closed when the thickness of the film reaches approximately 50 nm, and the film-forming of the α-NPD is finished.

Then, similarly, a heating temperature is controlled until the $Alq_3$ in the second boat reaches a constant speed which is an evaporation speed of 0.3 nm/sec, the shutter provided at the upper part in the vacuum evaporation device is opened so as to start film-forming of the $Alq_3$. The shutter is closed when the thickness of the film reaches approximately 55 nm, and the film-forming of the $Alq_3$ is finished.

As described above, the hole transport layer 3 made of the α-NPD and the organic luminescent layer 4 made of the $Alq_3$ are formed on the anode 2.

Next, while keeping vacuum, the transparent insulation substrate 1 is moved to another vacuum evaporation device 20 as shown in FIG. 5 connected the above-mentioned vacuum evaporation device. As shown in FIG. 4C, the first cathode 5A is formed on the organic luminescent layer 4.

The vacuum evaporation device 20, as shown in FIG. 5, is provided with a chamber 11, boat support bases 12A and 12B positioned on a bottom of the chamber 11, a substrate support 13 and a shutter 14 arranged at an upper part of the chamber 11, a shutter driving section 15 for controlling a position of the shutter 14 in a horizontal direction, an oxygen gas source 16 prepared outside the chamber 11, a gas tube 18 for supplying oxygen gas from the oxygen gas source 16 to a gas introduction terminal port 17 extended to a surface of the transparent insulation substrate 1 supported by the substrate support 13, and a mass flow controller 19 arranged on the way of the gas tube 18. The vacuum evaporation device 20 is commonly available to another method of manufacturing the organic EL device according to the present invention.

In the chamber 11 of the vacuum evaporation device 20, a tungsten boat (third boat) 21A to which Li of 100 g is supplied and a tungsten boat (fourth boat) 21B to which Al of 1 g is supplied are arranged so as to be respectively connected to resistance heating sources (not shown). The Li is made by cutting a Li wire of diameter of 2 mm in tablets of which thickness is from 5 mm to 10 mm and then by leaving the tablets under an atmosphere including oxygen such as an air atmosphere for five minutes, more or less. Since Li is a very active metal, surfaces of the Li tablets are oxidized by leaving the Li tablets under the oxygen atmosphere, $Li_2O$ layers are formed on the surfaces of the Li tablets. The Li tablets are Auger-analyzed, and oxide layers of 5 μm to 8 μm after leaving the tablets for five minutes are recognized. Also, a flow of the oxygen gas introduced from the gas introduction terminal port 17 into the chamber 11 in the vacuum evaporation device 20 is controlled by the mass flow controller 19. Then, the chamber 11 in the vacuum evaporation device 20 is exhausted. When the degree of vacuum reaches $4 \times 10^{-4}$ Pa or less, the third boat 21A and the fourth boat 21B are heated by respective heating sources. After a heating temperature is controlled until an evaporation speed of Li in the third boat 21A reaches a constant speed of 0.02 to 0.03 nm/sec and an evaporation speed of Al in the fourth boat 21B reaches a constant speed of 0.4 nm/sec, the shutter 14 arranged at the upper part in the chamber 11 is moved by the shutter driving section 15 in the horizontal direction so as to be opened, and then a co-evaporation of Al and Li is started. When the thickness of a film reaches approximately 60 nm, the shutter 14 is closed and the co-evaporation is finished. Since $Li_2O$ is formed on a surface of Li, Li and $Li_2O$ are evaporated at the same time at a start of evaporation. However, since the $Li_2O$ is thinly formed on the surface, the $Li_2O$ decreases gradually as the evaporation advances. After the $Li_2O$ is completely evaporated, only the Li is evaporated. With these processes, the metallic oxide 8 made of the $Li_2O$ layer is formed.

As described above, with the co-evaporation of Al and Li, since the $Li_2O$ layer covers the defects which generate when the cathode 5 is stacked on the organic luminescent layer 4, the interface between the organic luminescent layer 4 and the cathode 5 is formed completely. In this case, the formed $Li_2O$ layer is different from the $Li_2O$ layer in a case in that the cathode 5 is stacked after the $Li_2O$ layer is stacked on the organic luminescent layer 4 evenly. In other words, as shown in FIG. 3, at a start of the co-evaporation of Al and Li, the $Li_2O$ layer on the surface of Li is co-evaporated together with the Li and the Al, however, the $Li_2O$ layer becomes thin gradually and disappears at the position d. Then, only the Al and the Li are co-evaporation between the position d and the position b. In this way, the $Li_2O$ layer becomes thin gradually as the co-evaporation advances, and the concentration gradient of the $Li_2O$ layer becomes a curved line.

An analysis thin film which is formed by leaving Li under an oxygen atmosphere by using a X-ray electronic spectroscopy technique so that a film is formed on a glass substrate and by forming an Al film thereon is analyzed. Oxygen increases as the Li, increases and oxidation is suggested. FIG. 6 shows an analysis result by using a relationship between an atomic concentration (vertical axis) and a film depth (horizontal axis). In FIG. 6, a broken line at a left side of a center shows a position approximately corresponding to an interface between Li and glass substrate. FIG. 6 shows not only Li and Al but also Si and O. The Si results from the glass substrate.

Subsequently, the heating to the resistance heating source of the third boat 21A is stopped, and only the fourth boat 21B is heated by the resistance heating source. The heating temperature is controlled until the evaporation speed of the Al in the fourth boat 21B reaches a constant speed of 0.6 nm/sec. Then, the shutter 14 is opened so that a film formation of Al is started. When the thickness of the film reaches approximately 100 nm, the shutter 14 is closed and the film-formation is finished.

As described above, since the Li on which the $Li_2O$ layer is formed is evaporated, the $Li_2O$ layer is included in the interface with the organic luminescent layer 4 of the first cathode 5A. Then, the $Li_2O$ layer functions in a manner that a stable level is formed in the interface between the organic luminescent layer 4 and the first cathode 5A, and therefore, the interface between the organic luminescent layer 4 and the first cathode 5A is completely formed. Further, the second cathode 5B is formed on the first cathode 5A and functions as the cathode together with the first cathode 5A.

Next, after the substrate 1 is moved to a sealed chamber, as shown in FIG. 4D, a cap 7 made of glass or a like is adhered to the transparent insulation substrate 1 via the seal resin 6 such as UV curable resin so as to be sealed. Then, the organic EL device 10 is completed. When the seal resin 6 is cured in sealing, UV-rays are irradiated only to the seal resin 6 by shielding the element main part including the anode 2, the hole transport layer 3, the organic luminescent layer 4, the first cathode 5A, and the second cathode 5B.

With the method of manufacturing the organic EL device 10, the $Li_2O$ layer which is metallic oxide is included in the interface between the first cathode 5A and the organic luminescent layer 4 to make the element characteristic stable. When the organic EL device 10 having the $Li_2O$ layer of the concentration gradient in which a concentration becomes high at the side of the interface with the organic luminescent layer 4 is manufactured, Li (metal easy to be oxidized) and Al (cathode material of low resistance) on which $Li_2O$ layer is previously formed under the air atmosphere by surface oxide are used as evaporation sources and are co-evaporated. Therefore, it is possible to form the $Li_2O$ layer having the above-mentioned concentration gradient. Therefore, since it is possible to form the first cathode 5A having the concentration gradient in which the concentration becomes high at the side of interface with the organic luminescent layer 4 according to control, it is possible to manufacture the organic EL device 10 with high yield and it is also possible to improve a throughput. Next, measured results of rectification characteristics of the organic EL device 10 manufactured by the method according to the first embodiment are explained by using a semiconductor parameter analyzer. The measurement is performed by applying a forward voltage and a backward voltage between the anode 2 and the second cathode 5B in the organic EL device 10. In addition, a luminescent area of the organic EL device 10 is 2 mm□ (2 mm×2 mm).

FIG. 7 is a view showing an example of a rectification characteristic of the organic EL device 10 and a result obtained by the above-mentioned measurement. A vertical axis represents a current value and a horizontal axis represents an applied voltage. When it is assumed that a ratio of a forward current If in a forward applied voltage of 8V and a reverse current Ir in a backward applied voltage of −8V is set as a rectification ratio (If/Ir), the reverse current Ir flows hardly. Therefore, a high rectification ratio of $4.7 \times 10^8$ is obtained, and it is confirmed that a good rectification characteristic is shown. Also, the driving voltage in a case of 100 $cd/m^2$ is low, namely, 3.5 V, and an improvement of the luminescent efficiency, namely, 13.1 lm/w is also confirmed. Particularly, the luminescent efficiency in a low voltage area is good.

Further, as a comparison example, FIG. 7 shows a rectification ratio obtained from an organic EL device including a $Li_2O$ layer at an interface between the first cathode 5A and the organic luminescent layer 4 and having no concentration gradient in the $Li_2O$ layer. In this comparison example, it is confirmed that the $Li_2O$ layer is thick and a threshold is high. In comparison with the first embodiment, a driving voltage in a case of 100 $cd/m^2$ is high, namely, 4.25 V, and a luminescent efficiency is low, namely, 10.0 lm/w. Particularly, the luminescent efficiency in a low voltage area is not good. Also, the rectification characteristic is slightly bad, namely, $6.1 \times 10^6$.

As apparent from the comparison between the first embodiment and the comparison example shown in FIG. 7, it is possible to obtain a high rectification ratio by the organic EL device according to the first embodiment. As its reason, it is considered that the interface between the organic luminescent layer 4 and the first cathode 5A is formed completely by the $Li_2O$ layer having the concentration gradient which becomes a high concentration at the side of the interface with the organic luminescent layer 4.

On the other hand, the rectification characteristic is not good in the comparison example. As its reason, the $Li_2O$ layer is included at the interface between the organic luminescent layer 4 and the first cathode 5A, however, the $Li_2O$ layer has no concentration gradient. Therefore, it is considered that defects remain in the interface between the organic luminescent layer 4 and the first cathode 5A.

Further, as a reference example, FIG. 8 shows a characteristic in a case of no $Li_2O$ layer. As apparent from FIG. 8, a rectification characteristic is remarkably bad.

As described above, in the organic EL device 10 according to the first embodiment, the $Li_2O$ layer which is metallic oxide is included at the interface between the organic luminescent layer 4 and the first cathode 5A, and the $Li_2O$ layer has the concentration gradient which becomes a high concentration at the side of the interface with the organic luminescent layer 4. Therefore, the defects existing in the interface between the organic luminescent layer 4 and the first cathode 5A are covered, and the complete interface is formed.

Further, in the method of manufacturing the organic EL device 10 according to the first embodiment, when the organic EL device 10 is manufactured, Li and Al on which $Li_2O$ layers are previously formed by surface oxide under the air atmosphere or the oxygen atmosphere are used as evaporation sources, and Al and Li are co-evaporated, therefore, it is possible to form a $Li_2O$ layer having the concentration gradient which becomes a high concentration at the side of the interface with the organic luminescent layer 4.

Therefore, it is possible to obtain a high rectification ratio, to obtain a low driving voltage, and to make the luminescent efficiency high.

Second Embodiment

Figure 9:
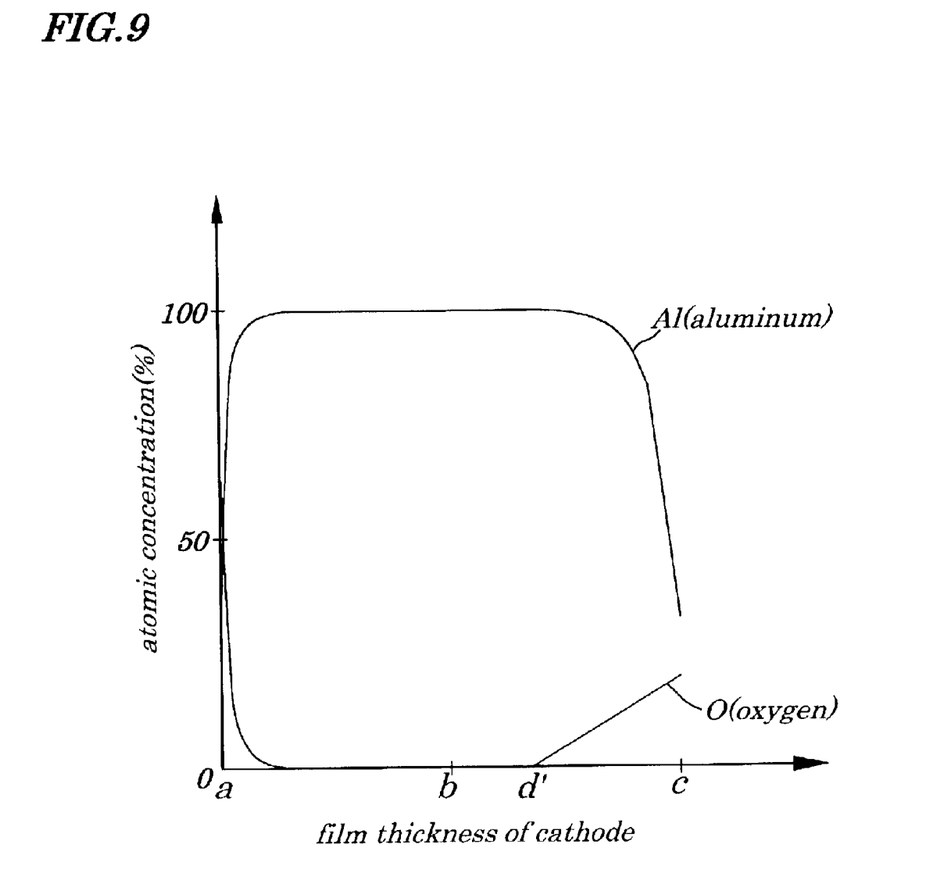
FIG. 9 is a view showing a relationship between a thickness of a cathode (horizontal axis) and an atomic concentration (vertical axis) in an organic EL device according to a second embodiment of the present invention as an Auger analysis result.

FIG. 9 is a view showing a relationship between a film thickness of a cathode (horizontal axis) and an atomic concentration (vertical axis) in an organic EL device according to a second embodiment of the present invention as an Auger analysis result. In the organic EL device according to the second embodiment, a main deference from that of the first embodiment is that a concentration gradient of metallic oxide varies linearly along a direction of a film thickness.

In other words, in the organic EL device according to the second embodiment, as shown in FIG. 9, an oxygen concentration in the first cathode 5A becomes a maximum at the interface with the organic luminescent layer 4 (position c), decreases gradually as apart from the interface in the direction of the film thickness, and becomes 0 (zero) at a position d' slightly more than a half of the film thickness. The concentration gradient varies linearly along the direction of the film thickness.

Others are approximately similar to those of the first embodiment. Therefore, since a structure of the organic EL device is similar to that of FIG. 1, explanations will be omitted. Next, a method of manufacturing the organic EL device according to the second embodiment will be explained in order of steps. As shown in FIG. 4C in the first embodiment, a transparent insulation substrate 1 on which an anode 2, a hole transport layer 3 and an organic luminescent layer 4 are sequentially stacked is moved into a vacuum evaporation apparatus 20 as shown in FIG. 5. Here, Li which no surface oxide is previously applied under an air atmosphere is supplied to a third boat 21A in the vacuum evaporation apparatus 20.

A chamber 11 of the vacuum evaporation apparatus 20 is exhausted. When the degree of vacuum reaches $4 \times 10^{-4}$ Pa, the flow of the oxygen gas is controlled so as to be approximately 5 SCCM (Standard Cubic Centimeter per Minute) by a mass flow controller 19, and oxygen gas is introduced near a surface of the transparent insulation substrate 1 from a gas introduction terminal port 17 in the chamber 11 of the vacuum evaporation apparatus 20. Then, the third boat 21A and a fourth boat 21B are heated by respective resistance heating sources (not shown). The heating temperature is controlled until the evaporation speed of the Li in the third boat 21A reaches a constant speed of 0.02 to 0.03 nm/sec and the evaporation speed of the Al in the fourth boat 21B reaches a constant speed of 0.4 nm/sec. A shutter 14 arranged at the upper part in the chamber 11 is moved in the horizontal direction by a shutter driving part 15 so as to be opened, and the co-evaporation of Li and Al is started. In this time, the degree of vacuum in the chamber 11 is $2 \times 10^{-3}$ Pa.

After starting the co-evaporation, the evaporation speed of the Li in the third boat 21A gradually decreases, and is controlled to be 0 nm/sec after approximate 100 seconds. At the same time, the oxygen gas is stopped being supplied. Then, when the film thickness reaches approximate 60 nm, the shutter 14 is closed, and the co-evaporation is finished. While the oxygen gas is introduced, a part of flying Li reacts with oxygen gas so as to produce a $Li_2O$ layer, and the $Li_2O$ layer is co-evaporated together with Li and Al as a cathode 5A. As the introduction flow of oxygen gas decreases, the production amount of the $Li_2O$ layer decreases. After stopping the introduction of the oxygen gas, only Al and Li are co-evaporated.

In this way, the first cathode made 5A of Al and Li and including the $Li_2O$ layer at the interface with organic luminescent layer 4 is formed on the organic luminescent layer 4. With the above-mentioned co-evaporation of Al and Li, similarly to the method of manufacturing an organic EL device 10 according to the first embodiment, since the $Li_2O$ layer covers defects which generate when the cathode 5A is stacked on the organic luminescent layer 4, the interface between the organic luminescent 4 and the cathode 5A is formed completely. In this case, a form of the $Li_2O$ layer is also different from a form in which the cathode 5A is stacked after the $Li_2O$ layer is previously stacked on the organic luminescent layer 4 evenly.

In other words, as shown in FIG. 9, at the start of the co-evaporation of Al and Li, the part of Li reacts with the oxygen gas so as to form the $Li_2O$ layer, however, as the evaporation speed of Li decreases and the oxygen gas decreases, the $Li_2O$ layer becomes thin and there is no $Li_2O$ layer at a position d' finally. Then, only Al and Li are co-evaporated between the position d' and a position b. In this way, as the co-evaporation advances, the $Li_2O$ layer becomes thin gradually, and the concentration gradient of the $Li_2O$ layer becomes linear. In addition, a point in which the concentration of the $Li_2O$ layer becomes 0 (zero) delays from a point in which the oxygen gas is stopped being introduced because of the oxygen gas remaining in the chamber 11 after setting the introduction of oxygen gas to 0 (zero).

Then, similarly to the first embodiment, heating by the resistance heating source of the third boat 21A is stopped, and only the fourth boat 21B is heated by the resistance heating source. After the heating temperature is controlled until the evaporation speed of the Al in the fourth boat 21B reaches a constant speed of 0.6 nm/sec, the shutter 14 is opened so as to start film-forming of Al. When the thickness of the film reaches 120 nm, the shutter is closed and the film-forming of Al is finished.

In this way, a second cathode 5B made of Al is formed on the first cathode 5A as shown in FIG. 4C in the first embodiment. After this step, similar steps of FIG. 4D are performed in order to complete the organic EL device.

With the organic EL device according to the second embodiment, it is possible to make the characteristic of the EL device stable, and it is possible to obtain a high rectification ratio. In the second embodiment, it is possible to obtain a high rectification ratio, namely, $2.0 \times 10^8$, it is confirmed that a good rectification characteristic is obtained.

Also, in the method of manufacturing the organic EL device according to the second embodiment, when the organic EL device is manufactured, Li and Al for which no surface oxide is previously performed under an air atmosphere are used as evaporation sources, and the Li and the Al are co-evaporated. Therefore, it is possible to form the $Li_2O$ layer having the concentration gradient in which a concentration is high at the side of the interface with the organic luminescent layer 4 automatically.

Therefore, it is possible to obtain a high rectification ratio without lowering the throughput in manufacturing the organic EL device.

As described above, according to the second embodiment, it is possible to obtain effects approximately similar to those of the first embodiment.

It is thus apparent that the present invention is not limited to the above embodiments but may be changed and modified without departing from the scope and spirit of the invention.

For example, the anode 2 formed on the transparent insulation substrate 1 is made of ITO in the embodiments, however another electrode material such as $SnO_2$ (tin oxide) can be used if only it is a transparent conductive material not limited to ITO.

Also, as to the cathode 5, not limited to the co-evaporation of AL and Li, co-evaporation of Mg and Ag and another electrode material such as only Al can be available, and it is preferable to make partial coexistence of materials which are easy to be oxidized.

Also, the hole transport material is not limited to the α-NPD, and another material such as bis(di(p-tolyl) aminophenol)-1,1-cyclohexane, N,N'-diphenyl-N,N'-bis(3-methylphenyl)-1,1'-biphenyl-4,4'-diamine, N,N'-diphenyl-N-N-bis(1-naphthyl)-(1,1'-biphenyl-4,4'-diamine, copper phthalocyanine, 4,4',4" tris (3-methyl phenylamine)-triphenylamine, 4-phenyl-4',4"-bis[di(3-methylphenyl) amino] triphenylamine, N,N'-diphenyl-N,N'-bis(3-methylphenyl)-1,1'-biphenyl-4,4'-diamine, another materials such as starburst type molecule can be used.

Also, in the embodiments, explanations are given in a case in that the element main part including the anode 2, the hole transport layer 3, the organic luminescent layer 4, the first cathode 5A, and the second cathode 5B is formed, however, the present invention is limited to this if only an interface between an organic luminescent layer 4 and a cathode layer 5 is formed. For example, it is possible to put an electron transport layer such as 2-(4-biphenyl)-5-(4-t-butylphenyl)-1,3,4-oxadiazole or bis (8-quinolinol) magnesium, bis (2-metyl-8-quinolinol) (1-phenolato) gallium between the organic luminescent layer 4 and the cathode 5. It is also possible to form another element main part such as a structure including an anode including no hole transport layer and no electron transport layer, an organic luminescent layer, and a cathode. Also, in a structure in which a cathode includes a plurality of layers, if only oxide is included in an interface of a cathode adjacent to an organic layer including at least an organic luminescent layer and of an organic layer.

Figure 10:
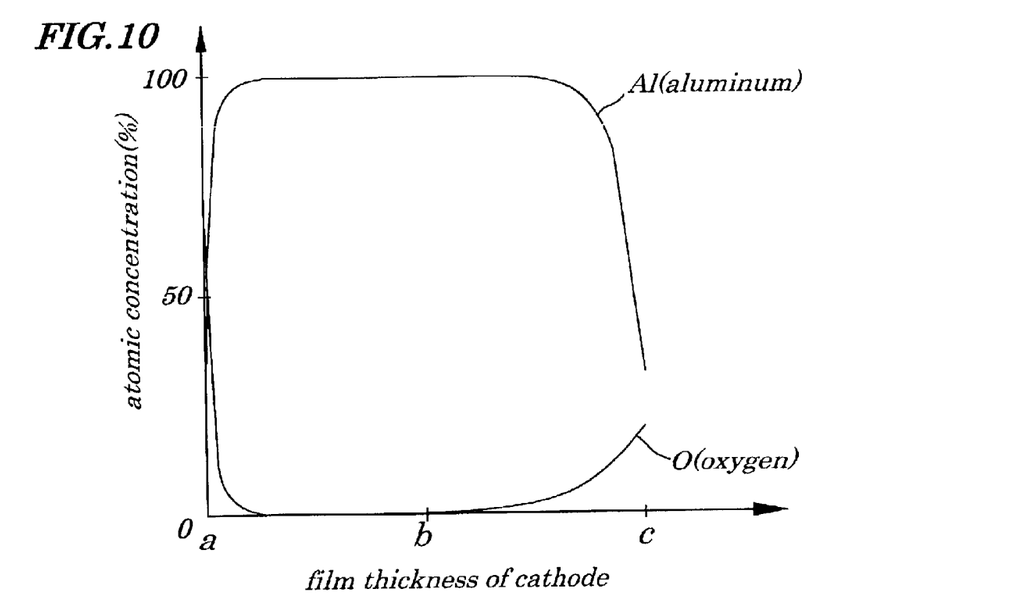
FIG. 10 is a view showing a relationship between a thickness of a cathode (horizontal axis) and an atomic concentration (vertical axis) in an organic EL device according to a modification of the first embodiment of the present invention as an Auger analysis result.
Figure 11:
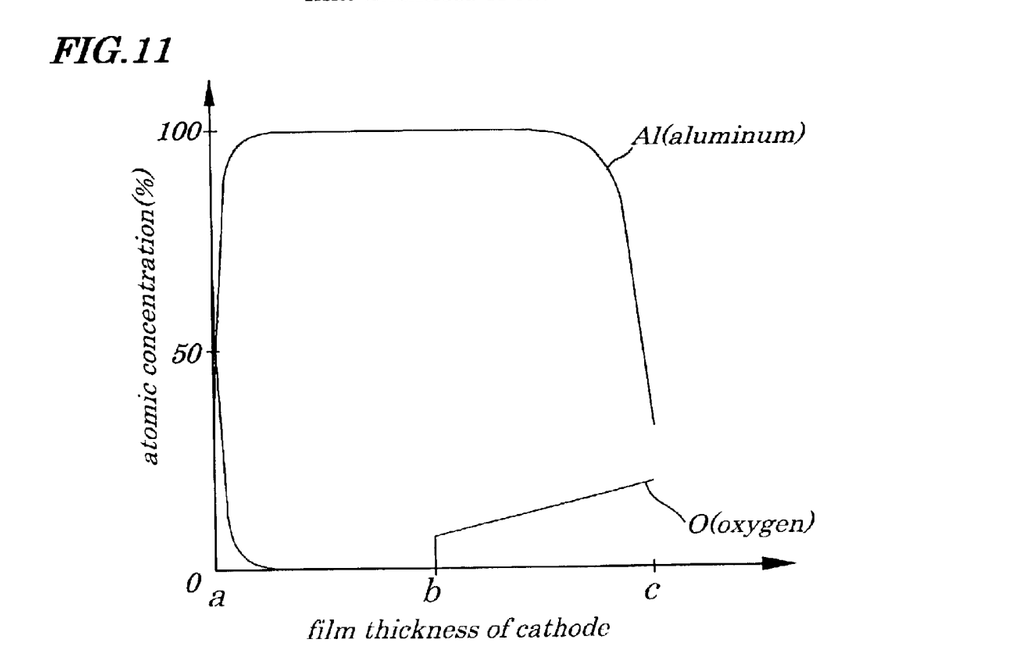
FIG. 11 is a view showing a relationship between a thickness of a cathode (horizontal axis) and an atomic concentration (vertical axis) in an organic EL device according to a modification of the second embodiment of the present invention as an Auger analysis result.

Further, as a modification example of the first embodiment, as shown in FIG. 10, an organic EL device in which a concentration of a $Li_2O$ layer becomes 0 (zero) at an interface (position b) between the first cathode 5A and the second cathode 5B is also available. As a modification example of the second embodiment, as shown in FIG. 10, an organic EL device in which a concentration of a $Li_2O$ layer does not become 0 (zero) at an interface between the first cathode 5A and the second cathode 5B is also available. But, these modification examples can not obtain effects more than the first embodiment and the second embodiment as explained with reference to FIG. 3.

What is claimed is:

1. An organic EL device comprising:

an anode made of a transparent electrode, an organic layer including an organic luminescent layer, and a cathode sequentially stacked on a transparent insulation substrate, said cathode including metallic oxide in an interface with said organic layer wherein;

said metallic oxide is formed so as to have a concentration gradient in which a concentration becomes high at a side of said interface with said organic layer and varies curvedly along a direction of a film thickness of said cathode.

2. The organic EL device according to claim 1, wherein said cathode includes a first cathode and a second cathode and said first cathode includes said metallic oxide in said interface with said organic layer.

3. The organic EL device according to claim 1, wherein said cathode includes a plurality of layer and a cathode among said plurality of layers includes said metallic oxide in said interface wit said organic layer.

4. The organic EL device according to claim 1, wherein a concentration of said metallic oxide becomes 0 (zero) in a thickness of said cathode forming said interface with said organic layer.

5. An organic EL device comprising:

an anode made of a transparent electrode, an organic layer including an organic luminescent layer, and a cathode sequentially stacked on a transparent insulation substrate, said cathode including metallic oxide in interface with said organic layer wherein;

said metallic oxide is formed so as to have a concentration gradient in which a concentration becomes high at a side of said interface with said organic layer and varies linearly along a direction of a film thickness of said cathode.

6. The organic EL device according to claim 5, wherein said cathode includes a first cathode and a second cathode and said first cathode includes said metallic oxide in said interface with said organic layer.

7. The organic EL device according to claim 5, wherein said cathode includes a plurality of layers and a cathode among said plurality of layers includes said metallic oxide in said interface with said organic layer.

8. The organic EL device according to claim 5, wherein a concentration of said metallic oxide becomes 0 (zero) in a thickness of said cathode forming said interface with said organic layer.

* * * * *